(12) United States Patent
Kim et al.

(10) Patent No.: US 6,653,197 B2
(45) Date of Patent: Nov. 25, 2003

(54) METHOD FOR FABRICATING CAPACITOR OF SEMICONDUCTOR DEVICE

(75) Inventors: Kyong Min Kim, Kyoungki-do (KR); Kwang Jun Cho, Seoul (KR); Jong Min Lee, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 211 days.

(21) Appl. No.: 09/867,657

(22) Filed: May 31, 2001

(65) Prior Publication Data
US 2002/0048877 A1 Apr. 25, 2002

(30) Foreign Application Priority Data
Jun. 1, 2000 (KR) ........................................ 2000-30089

(51) Int. Cl.⁷ .............................................. H01L 21/20
(52) U.S. Cl. .................... 438/396; 438/240; 438/253; 438/785
(58) Field of Search ................................ 438/396, 240, 438/253, 785, 786

(56) References Cited

U.S. PATENT DOCUMENTS

| | | | | |
|---|---|---|---|---|
| 6,338,995 B1 | * | 1/2002 | Hwang et al. | 438/240 |
| 6,340,622 B1 | * | 1/2002 | Lee et al. | 438/396 |
| 6,410,381 B2 | * | 6/2002 | Kim et al. | 438/240 |
| 6,458,645 B2 | * | 10/2002 | DeBoer et al. | 438/240 |
| 2001/0036703 A1 | * | 11/2001 | Lee et al. | 438/255 |
| 2002/0025646 A1 | * | 2/2002 | Kim et al. | 438/396 |

* cited by examiner

Primary Examiner—Michael Trinh
Assistant Examiner—Christy Novacek
(74) Attorney, Agent, or Firm—Finnegan, Henderson, Farabow, Garrett & Dunner, L.L.P.

(57) ABSTRACT

Disclosed herein is a method for the fabrication of a capacitor of semiconductor device, which is capable of increasing a charge storage capacitance of the capacitor while generation of leakage current in the capacitor. The method comprises the steps of: forming a ruthenium film as a lower electrode on a semiconductor substrate; forming a TaON film having a high dielectric constant on the ruthenium film; and forming a upper electrode on the TaON film.

15 Claims, 3 Drawing Sheets

METHOD FOR FABRICATING CAPACITOR OF SEMICONDUCTOR DEVICE

CROSS-REFERENCE TO RELATED APPLICATIONS

This application claims priority from Korean Patent Application No. 2000-30089, filed Jun. 1, 2000, the entirety of which is incorporated herein by reference.

BACKGROUND OF THE INVENTION

1. Field of the Invention

The present invention relates in general to a method for the fabrication of a capacitor of a semiconductor memory device, and more particularly to a method of fabricating a capacitor of a semiconductor device, which is capable of increasing a charge storage capacitance of the capacitor while preventing generation of leakage current in the capacitor.

2. Description of the Related Art

With recent advances in semiconductor fabrication technology, the demand for memory devices had increased rapidly. In semiconductor devices, a capacitor being used as a data storage element is varied in its capacitance depending on the area of its electrodes, the distance between the electrodes, and the dielectric constant of the dielectric film interposed between the electrodes.

However, as the integration density of a semiconductor device is increased, the capacitor is reduced in the area that it occupies in the semiconductor device and thus is the area of its electrodes is reduced, thereby reducing its capacitance.

For this reason, to maximize the capacitance of the capacitor, the prior art includes depositing a ruthenium film as the lower electrode on a substrate, depositing a TaON film having high dielectric constant on the ruthenium film, and depositing a metal film on the dielectric film, thereby forming a capacitor structure of metal film-dielectric film-metal film (MIM).

FIGS. 1a and 1b show a fabricating method of a capacitor of a semiconductor device according to the prior art. As shown in FIG. 1a, on a semiconductor device 2 having a MOS transistor (not shown), there is formed an interlayer insulating film 4 having a contact hole (not shown) through which one of junction regions of the MOS transistor is exposed.

After this, a polysilicon film 5 for a plug is filled in the interlayer insulating film 4, and then etched back to remove a native oxide film. Then, a Ti/TiN film 6 as a barrier metal film is deposited on the resulting substrate.

Afterwards, as shown in FIG. 1b, a ruthenium film 7 as a lower electrode is deposited on the barrier metal film 6 using an $O_2$ gas as a reaction gas. The $O_2$ gas used in this step makes the deposition of the ruthenium film 7 easy by breaking down the molecular structure of tris(2,4-octanedionato)ruthenium used as a ruthenium source.

Then, a TaON film 8 having a good dielectric constant is formed on the ruthenium film 7. Next, an upper electrode 9 is formed on the TaON film 8 to complete a capacitor of a semiconductor memory device.

However, such a prior method for the fabrication of the capacitor suffers from problems as described below.

The prior method employs the $O_2$ gas in deposition of the ruthenium film as the lower electrode. This $O_2$ gas makes deposition of the ruthenium film 7 easy by breaking down the molecular structure of tris(2,4-octanedionato)ruthenium as a ruthenium source, but causes carbons to remain in the ruthenium film, thereby deteriorating electrical properties of the resulting capacitor.

Thus, in order to remove carbons present in the ruthenium film and improve properties of the ruthenium, the prior art performs a subsequent heat-treatment, such as Rapid Thermal Processing (RTP), under an atmosphere of $N_2$, Ar or $Ar/N_2$. This results in loss in fabricating time and economical efficiency.

SUMMARY OF THE INVENTION

The present invention solves prior problems as described above and provides a fabricating method of a capacitor of a semiconductor device, which can improve electrical properties of the capacitor.

Additionally, the present invention provides a fabricating method of a capacitor of a semiconductor memory device, which is capable of increasing a charge storage capacitance of the capacitor while preventing generation of leakage current in the capacitor.

In one embodiment, the present invention provides a method for the fabrication of a capacitor of a semiconductor device, comprising the steps of forming a ruthenium film as a lower electrode on a semiconductor substrate; forming a TaON film having a high dielectric constant on the ruthenium film; and forming an upper electrode on the TaON film.

In another embodiment, the present invention provides a method for the fabrication of a capacitor in a semiconductor device, comprising the steps of forming a ruthenium film as a lower electrode on a semiconductor substrate; forming an amorphous TaON film having a high dielectric constant on the ruthenium film; annealing the amorphous TaON film to form a crystalline TaON film; and forming an upper electrode on the crystalline TaON film.

DETAILED DESCRIPTION OF THE INVENTION

A preferred embodiment of a fabricating method of a capacitor of a semiconductor device according to the present invention will now be described in detain with reference to the accompanying drawings.

Figure 1A:
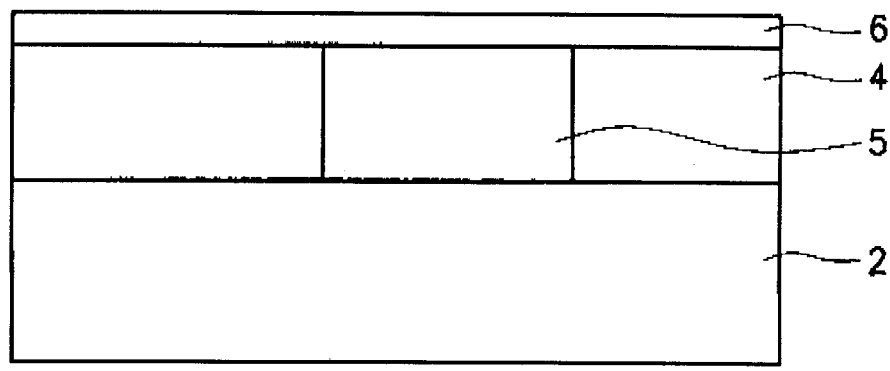
FIGS. 1a and 1b are cross-sectional views describing a fabricating method of a capacitor of a semiconductor device according to the prior art.
Figure 1B:
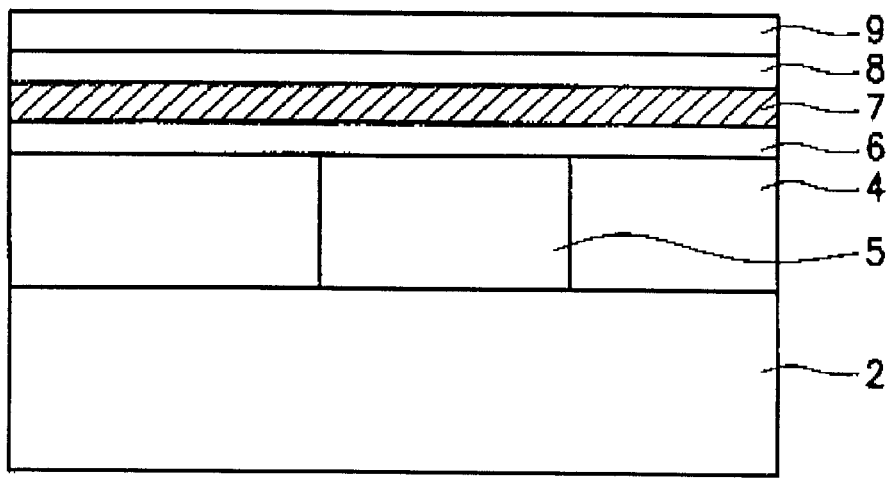
Figure 2A:
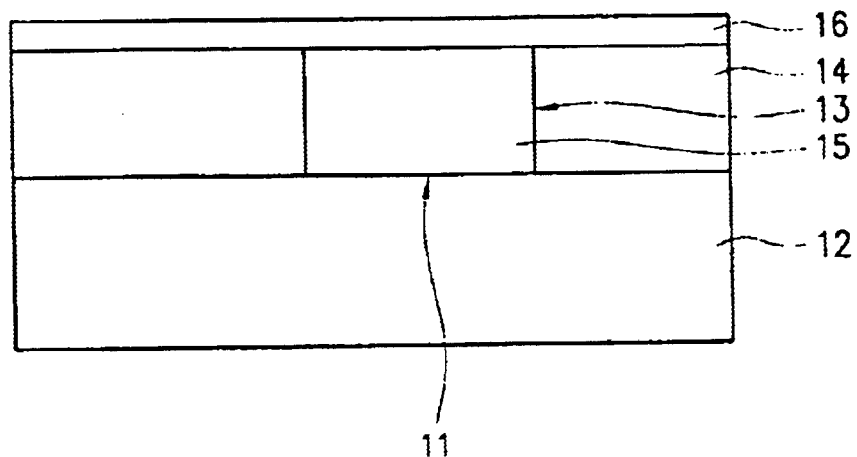
FIGS. 2a and 2d are cross-sectional views describing a fabricating method of a capacitor of a semiconductor device according to the present invention.
Figure 2B:
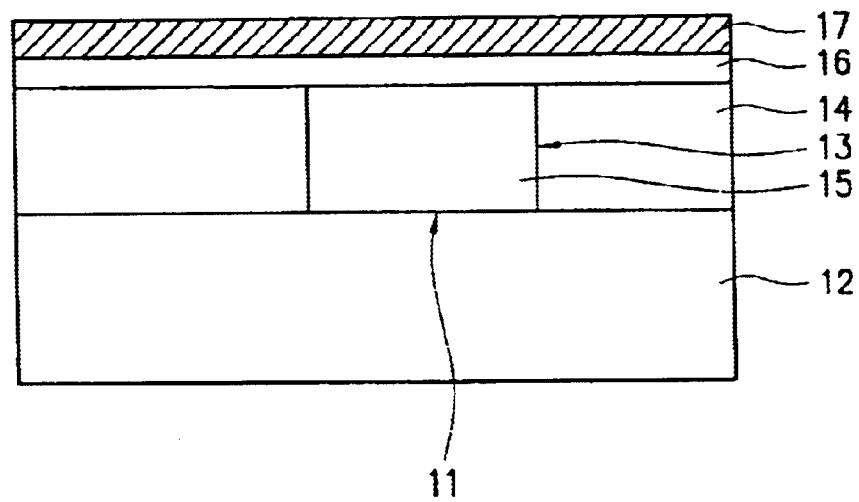
Figure 2C:
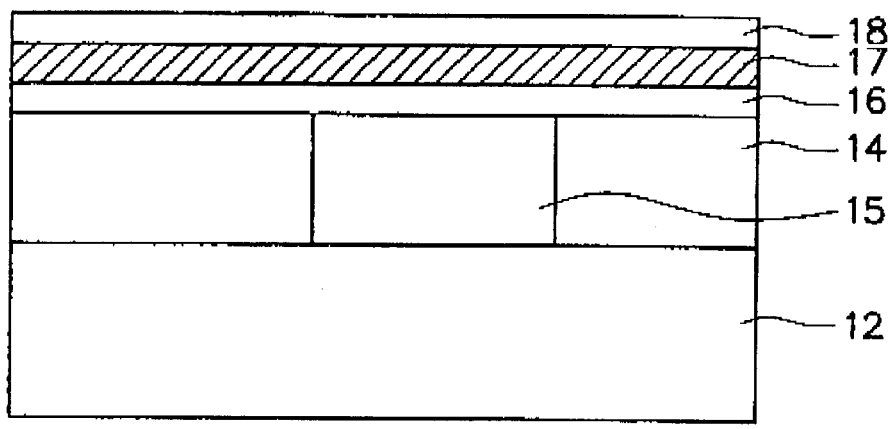
Figure 2D:
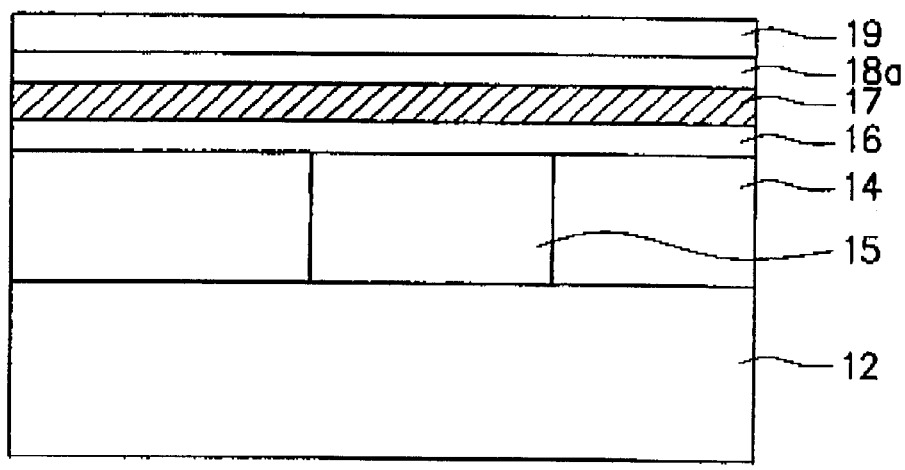

FIGS. 2a and 2d are cross-sectional views describing a fabricating method of a capacitor of a semiconductor device according to the present invention.

Referring to FIG. 2a, on a semiconductor device 12 having a substrate and a MOS transistor (not shown), there is an interlayer insulating film 14 having a contact hole 13 through which one of junction regions (not shown) of the MOS transistor is exposed.

Then, a plug polysilicon film 15 is formed on the interlayer insulating film 14 in such a manner that it fills in the contact hole 13 of the interlayer insulating film 14. Next, the polysilicon film 15 is etched back at its surface using a HF solution or a buffer oxide as an etching regent to remove a native oxide film.

Following this, on the resulting substrate, there are deposited a Ti film and a TiN film to a thickness of 100 Å to 500 Å, respectively, thereby forming a barrier metal film 16.

As shown in FIG. 2b, on the barrier metal film 16 is deposited a ruthenium film 17 as a lower electrode. At this time, $NH_3$ gas is used as a reaction gas for deposition of the ruthenium film 17. The use of $NH_3$ gas inhibits the amount of carbons present in the ruthenium film 17. Also, this $NH_3$ gas serves as a Lewis base, so that it weakens a bond strength of CH groups present in the ruthenium film 17 during deposition, thereby removing easily the CH groups from the ruthenium film 17.

During deposition of the ruthenium film 17 as the lower electrode, tris(2,4-octanedionato)ruthenium in vapor phase is used as a ruthenium source, and the semiconductor substrate 11 is maintained at a temperature of 200° C. to 350. Moreover, $O_2$ and $NH_3$ gases used as reaction gases for deposition of the ruthenium film 17 are maintained at a flow rate from several tens to several hundreds SCCM, and a reactor chamber is maintained at a pressure of several mTorr to several Torr. In addition, the ruthenium film 17 is preferably deposited to a thickness of 100 Å to 500 Å.

Then, as shown in FIG. 2c, on the ruthenium film 17 is deposited an amorphous TaON film 18, as a dielectric film, which has an excellent dielectric constant. At this time, tantalum ethylate ($Ta(OC_2H_5)_5$) is used as a tantalum source. As $Ta(OC_2H_5)_5$ is present in liquid phase as known in the art, it must be supplied into a LPCVD chamber after being transformed into vapor phase.

For formation of the TaON film 18, $Ta(OC_2H_5)_5$ as the tantalum source is vaporized in a vaporizer at a temperature of 170 to 190° C. to produce a Ta chemical vapor. The Ta chemical vapor is reacted with a $NH_3$ gas in the LPCVD chamber which is maintained at a pressure of 0.1 to 1.2 Torr and at a temperature of 350 to 450° C. and into which the $NH_3$ gas is supplied at a flow rate of 10 to 1000 standard cubic centimeters per minute (SCCM). This reaction yields the amorphous TaON film 18.

Then, as shown in FIG. 2d, the amorphous TaON film 18 is subjected to a RTP annealing for 1 to 5 minutes at a temperature 500 to 700° C. under an atmosphere of $N_2$ or $O_2$, thereby forming a crystallized TaON film 18a.

Then, on the TaON film 18a is deposited an upper film, such as a TiN film 19 or a metal film, to complete a capacitor of a semiconductor device.

Meanwhile, the method of the present invention may also be applied to the fabrication of a cylinder-type, stack-type, or trench-type capacitor, etc. without departing the sprit and scope of the present invention.

As apparent from the foregoing, the method of the present invention employs a $NH_3$ gas instead of an $O_2$ gas as the reaction gas, upon formation of the ruthenium film as the lower electrode. This inhibits the amount of carbons present in the lower electrode, thereby improving the electrical properties of the resulting capacitor. In addition to this advantage, as the method of the present invention does not require a subsequent annealing process of removing carbons from the lower electrode, it can reduce fabricating time and cost.

Further, the method of the present invention forms the TaON film having an excellent dielectric constant on the lower electrode. This can meet an increasing demand for memory devices and a requirement for a high capacitance per a small capacitor area.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a capacitor in a semiconductor device, comprising:

forming a ruthenium film as a lower electrode on a semiconductor substrate;

forming a TaON film on the ruthenium film; and forming an upper electrode on the TaON film, wherein forming the ruthenium film comprises using tris(2,4-octanedionato)ruthenium in vapor phase as a ruthenium source; maintaining the semiconductor substrate at a temperature ranging from 200° C. to 350; supplying $O_2$ and $NH_3$ gases as reaction gases at flow rates independently ranging from more than 20 to less than 1,000 SCCM; and maintaining a reactor chamber at a pressure ranging from more than 2 mTorr to less than 10 Torr.

2. The method of claim 1, further comprising, prior to forming the ruthenium film:

forming a contact hole on the semiconductor substrate;

filling a plug shaped polysilicon film in the contact hole;

etching back a surface of the polysilicon film using at least one of a HF solution and a buffer oxide as an etching reagent to remove a native oxide film; and forming a Ti film and a TiN film as barrier metal films on the resulting substrate, each said film independently having a thickness ranging from 100 to 500 Å.

3. The method of claim 1, wherein the ruthenium film has a thickness ranging from 100 to 500 Å.

4. The method of claim 1, wherein the upper electrode comprises at least one of a TiN film and a metal film.

5. The method of claim 1, wherein the TaON film is an amorphous film formed by reacting a vapor comprising Ta with $NH_3$ gas in a low pressure chemical vapor deposition (LPCVD) chamber maintained at a pressure ranging from 0.1 to 1.2 Torr and a temperature ranging from 350 to 450° C., wherein the vapor comprising Ta is formed by vaporizing a tantalum source comprising tantalum ethylate ($Ta(OC_2H_5)_5$)) in a vaporizer maintained at a temperature ranging from 170 to 190° C.; and wherein the $NH_3$ gas is supplied into the LPCVD chamber at a flow rate ranging from 10 to 1000 SCCM.

6. The method of claim 5, further comprising crystallizing the TaON film to form a crystallized TaON film, said crystallizing comprising an RTP annealing process for a time ranging from 1 to 5 minutes at a temperature ranging from 500 to 700° C. under an atmosphere comprising at least one of $N_2$ and $O_2$.

7. A method of fabricating a capacitor in a semiconductor device, comprising:

forming a ruthenium film as a lower electrode on a semiconductor substrate;

forming an amorphous TaON film on the ruthenium film;

annealing the amorphous TaON film to form a crystalline TaON film; and forming an upper electrode on the crystalline TaON film, wherein forming the ruthenium film comprises using tris(2,4-octanedionato)ruthenium in vapor phase as a ruthenium source; maintaining the semiconductor at a temperature ranging from 200° C. to 350; supplying $O_2$ and $NH_3$ gases as reaction gases at flow rates independently ranging from more than 20 to less than 1,000

SCCM; and maintaining a reactor chamber at a pressure ranging from more than 2 mTorr to less than 10 Torr.

8. The method of claim 7, further comprising, prior to forming the ruthenium film:

forming a contact hole on the semiconductor substrate;

filling a plug shaped polysilicon film in the contact hole;

etching back a surface of the polysilicon film using at least one of a HF solution and a buffer oxide as an etching reagent to remove a native oxide film; and forming a Ti film and a TiN film as barrier metal films on the resulting substrate, each said film independently having a thickness ranging from 100 to 500 Å.

9. The method of claim 7, wherein the ruthenium film has a thickness ranging from 100 to 500 Å.

10. The method of claim 7, wherein forming the amorphous TaON film comprises reacting a vapor comprising Ta with $NH_3$ gas in a low pressure chemical vapor deposition (LPCVD) chamber maintained at a pressure ranging from 0.1 to 1.2 Torr and a temperature ranging from 350 to 450° C., wherein the vapor comprising Ta is formed by vaporizing a tantalum source comprising tantalum ethylate ($Ta(OC_2H_5)_5$)) in a vaporizer maintained at a temperature ranging from 170 to 190° C.; and wherein the $NH_3$ gas is supplied into the LPCVD chamber at a flow rate ranging from 10 to 1000 SCCM.

11. The method of claim 7, wherein the annealing comprises annealing for a time ranging from 1 to 5 minutes at a temperature ranging from 500 to 700° C. under an atmosphere comprising at least one of $N_2$ and $O_2$.

12. The method of claim 7, wherein the upper electrode comprises at least one of a TiN film and a metal film.

13. A method of forming a capacitor in a semiconductor device, comprising:

providing a semiconductor substrate;

forming a contact hole on the semiconductor substrate;

filling a plug shaped polysilicon film in the contact hole;

forming a Ti film and a TiN film as barrier metal films on the resulting substrate;

forming a ruthenium film on the resulting substrate;

forming an amorphous TaON film on the ruthenium film;

annealing the amorphous TaON film to form a crystalline TaON film; and forming an upper electrode on the crystalline TaON film, said upper electrode comprising at least one of a TiN film and a metal film, wherein forming the ruthenium film comprises using tris(2,4-octanedionato)ruthenium in vapor phase as a ruthenium source; maintaining the semiconductor at a temperature ranging from 200° C. to 350; supplying $O_2$ and $NH_3$ gases as reaction gases at flow rates independently ranging from more than 20 to less than 1,000 SCCM; and maintaining a reactor chamber at a pressure ranging from more than 2 mTorr to less than 10 Torr.

14. The method according to claim 13, wherein said ruthenium film has a thickness ranging from 100 to 500 Å.

15. The method according to claim 13, wherein the annealing comprises annealing for a time ranging 1 to 5 minutes at a temperature ranging from 500 to 700° C. under an atmosphere comprising at least one of $N_2$ and $O_2$.

* * * * *